(12) United States Patent
Xie et al.

(10) Patent No.: US 12,333,154 B2
(45) Date of Patent: Jun. 17, 2025

(54) REDUCING BIT ERROR RATE IN MEMORY DEVICES

(71) Applicant: Micron Technology, Inc., Boise, ID (US)

(72) Inventors: Tingjun Xie, Milpitas, CA (US); Yang Liu, San Jose, CA (US); Jiangli Zhu, San Jose, CA (US); Juane Li, Milpitas, CA (US); Aaron Lee, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/219,023

(22) Filed: Jul. 6, 2023

(65) Prior Publication Data

US 2024/0069748 A1 Feb. 29, 2024

Related U.S. Application Data

(60) Provisional application No. 63/402,406, filed on Aug. 30, 2022.

(51) Int. Cl.
*G06F 3/06* (2006.01)

(52) U.S. Cl.
CPC ............ *G06F 3/0619* (2013.01); *G06F 3/064* (2013.01); *G06F 3/0653* (2013.01); *G06F 3/0679* (2013.01)

(58) Field of Classification Search
CPC ...... G06F 3/0619; G06F 3/064; G06F 3/0653; G06F 3/0679; G11C 29/021; G11C 29/028; G11C 29/52
See application file for complete search history.

(56) References Cited

U.S. PATENT DOCUMENTS

| 11,282,564 | B1* | 3/2022 | Rayaprolu | ........ | G11C 29/50004 |
| 2016/0170871 | A1* | 6/2016 | Hyun | ................... | G06F 3/0653 |
| | | | | | 711/103 |
| 2016/0378400 | A1* | 12/2016 | Yang | ..................... | G06F 3/0616 |
| | | | | | 711/156 |
| 2021/0263821 | A1* | 8/2021 | Yang | ..................... | G11C 29/021 |

* cited by examiner

*Primary Examiner* — Jason W Blust
(74) *Attorney, Agent, or Firm* — Lowenstein Sandler LLP

(57) ABSTRACT

A processing device in a memory sub-system performs a first media scan operation with respect to a plurality of memory pages addressable by the ordinary wordline, wherein each page of the plurality of memory pages is contained by a respective management unit, and responsive to determining that a value of a data state metric of a memory page of the plurality of memory page addressable by the ordinary wordline satisfies a specified condition, performs a first media management operation with respect to a management unit containing the memory page. The processing device further performs a second media scan operation with respect to a plurality of memory pages addressable by the mandatory wordline, wherein each page of the plurality of memory pages is contained by the respective management unit, and responsive to determining that a value of the data state metric of a memory page of the plurality of memory page addressable by the mandatory wordline satisfies the specified condition, performs a second media management operation with respect to the management unit containing the memory page.

20 Claims, 7 Drawing Sheets

REDUCING BIT ERROR RATE IN MEMORY DEVICES

CROSS REFERENCE TO RELATED APPLICATIONS

This application claims priority to U.S. Provisional patent application No. 63/402,406 titled "REDUCING BIT ERROR RATE IN MEMORY DEVICES," filed on Aug. 30, 2022, the entire contents of which is incorporated herein by reference.

TECHNICAL FIELD

Embodiments of the disclosure relate generally to memory sub-systems, and more specifically, relate to systems and methods for reducing first read raw bit error rate in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
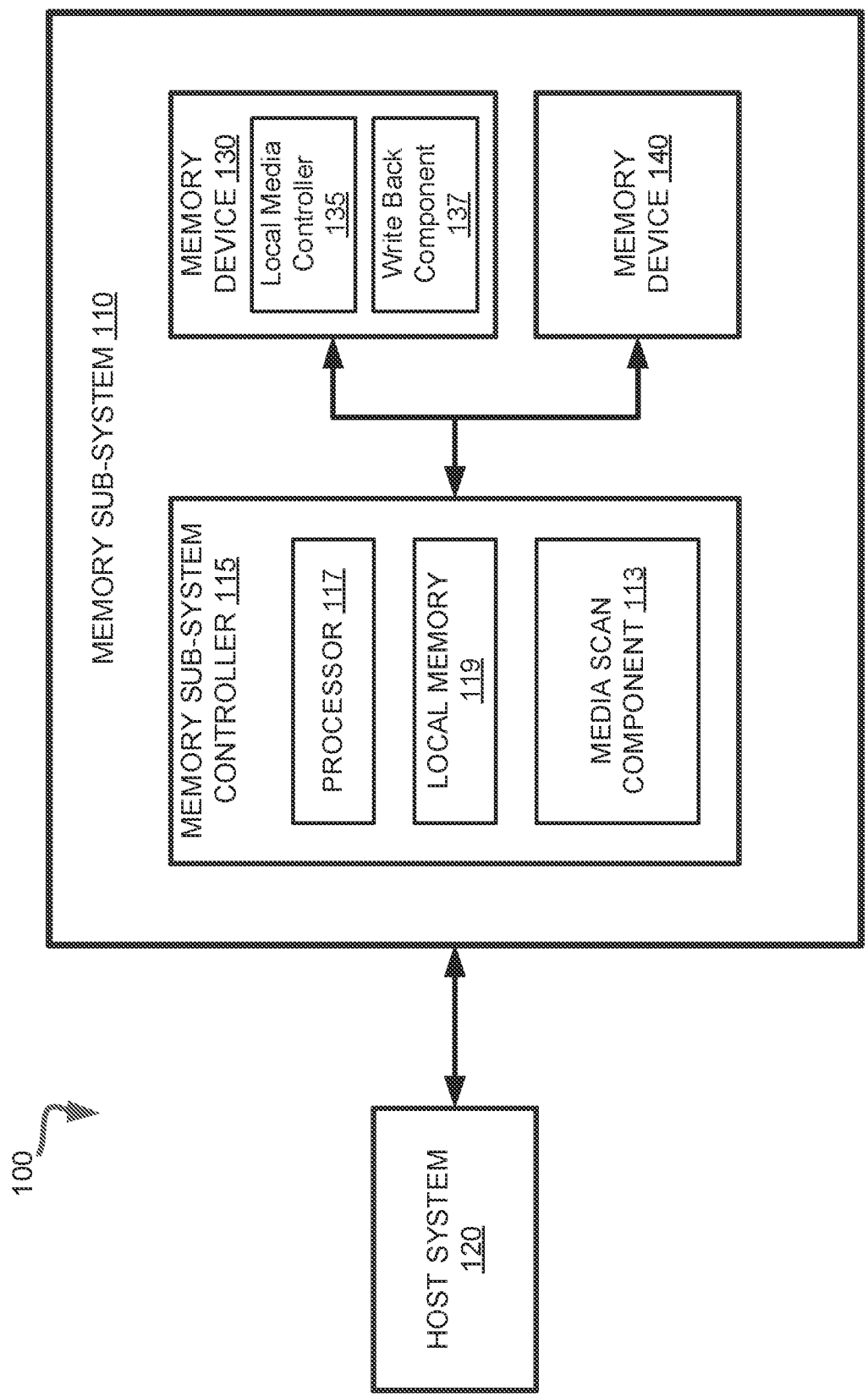
FIG. 1 illustrates an example computing system that includes a memory sub-system in accordance with some embodiments of the present disclosure.

Aspects of the present disclosure are directed to systems and methods for performing a media scan operation and reducing first read raw bit error rate in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a three-dimensional cross-point ("3D cross-point") memory device that is a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1. Each of the memory device can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. Similarly, a multi-level cell (MLC) can store two bits per cell, a triple level cell (TLC) can store three bits per cell, a quad level cell (QLC) can store four bits per cell, and a penta level cell (PLC) can store five bits per cell. The memory sub-system includes a memory sub-system controller that can communicate with the memory devices to perform operations such as reading data, writing data, or erasing data at the memory devices and other such operations. A memory sub-system controller is described in greater below in conjunction with FIG. 1.

The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. The metadata and host data, together, is hereinafter referred to as "payload." Metadata, host data, and parity data, which is used for error correction, can collectively form an error correction code (ECC) codeword (CW). Metadata can also include data version (e.g. used to distinguish age of data written), valid bitmap (which LBAs or logical transfer units contain valid data), etc.

When performing memory access operations, such as read operations (e.g., in response to a received memory access request/command), a memory sub-system can correct the errors present in the data being read. For example, upon reading data from a memory device, the memory sub-system controller can perform an error detection and correction operation. The error detection and correction operation includes identifying one or more errors (e.g., bit flip errors) in the read data. The memory sub-system can have the ability to correct a certain number of errors (e.g., using an error correction code (ECC)). As long as the number of errors in the data is within the ECC capability of the memory sub-system, the errors can be corrected before the data is provided to the requestor (e.g., the host system). The fraction of bits that contain incorrect data before applying ECC is called the raw bit error rate (RBER). The fraction of bits that contain incorrect data after applying ECC is called the uncorrectable bit error rate (LIBER). In an attempt to prevent those same errors from being present when a subsequent memory access operation is performed on the same management unit (e.g., a block or a page or a superblock), the memory sub-system can perform a writeback operation. As used herein, a superblock can refer to a collection of physical blocks that include a physical block from each plane within a corresponding group. In one or more embodiments, a superblock can span across multiple memory devices. For example, a superblock can be a collection of physical blocks that include a physical block from a plane within each of at least two memory arrays within different memory devices within a corresponding group. In a writeback operation, the data from the management unit is overwritten with the corrected data that was just read from the memory device. Thus, any errors that were present in the data when it was read will be corrected so that those errors are not present going forward. However, certain memory sub-systems lack any feedback mechanism to ensure that no errors are introduced to the data during the writeback operation. Furthermore, there is no way to determine the physical location on the storage media where the management unit is degraded.

Negative-and (NAND) blocks include a set of pages which are organized into page stacks or groups of pages which are written together. The pages can be numbered from 0 to N−1 with certain groups of pages paired together for programming, and the pages can be programmed in a particular order in order to guarantee data integrity. For example, if pages 0 and 1 form a page stack together, followed by pages 2 and 3, 4 and 5, and 6 and 7, each of these page stacks would be programmed in an increasing order. Some programming schemes may require multiple passes where a page stack is programmed on an initial pass and is left in an intermediary state, and later programmed again for a second or even a third pass until the page stack is fully programmed in its final, programmed state. Page stacks can also be grouped into sets which share the same wordline. A programming operation of a NAND page stack may result in either a program pass or program failure status. However, a passing status from a programming operation does not necessarily guarantee data integrity and the programming operation may have actually resulted in what is referred to as a "silent program failure" where data integrity is compromised even though a passing programming status was received. Higher, system level mechanisms are required to protect against these silent program failures and to avoid exposing too many data loss events to the host system, which is reading data from the memory device including the NAND blocks. For better performance, a certain uncorrectable bit error rate (UBER) is required such that only some number of bits of data are uncorrectable by the memory sub-system out of X bits read. For example, an UBER of 1e-Y requires that only 1 bit out of $1*10^{\wedge}Y$ bits read was not error corrected by the memory sub-system. Therefore, a lower UBER results in better performance of the memory sub-system.

According to the number of bits stored in each cell, each WL can contain one or more pages (e.g. SLC:1, MLC:2, TLC:3, QLC:4). The NAND read operations are based on pages, and each page includes one or more codewords (CWs). The codewords are a basic unit of ECC encoding or decoding. The data quality in the NAND cells can degrade due to several mechanisms (e.g. data retention (DR), read disturb (RD), latent read disturb (LRD), etc.), which cause high raw bit error rate (RBER), high trigger rate (TR), and eventually result in reliability (REL) issues. Due to the physical and/or electrical characteristics of NAND processes, certain WLs are inherently relatively "weaker" than other WLs in terms of RBER, TR, and REL Such wordlines are generally referred to as 'mandatory WLs,' and may be defined as wordlines that trigger more error handling operations than the remaining wordlines of the memory device.

Each block in a memory sub-system can be in a stable (S) state or a transient (T) state, depending on the operational history on the block. A block in the T-state has a lower read RBER when compared to a block in the S-state. A block is in T-state just after a program operation or a short time after a read operation (i.e., within a predefined time window following a memory access operation performed on the block, where the duration of time window is defined by the type of the memory access operation). The read operation can be any media sensing operation performed on any page of the block. A block in the S-state can exhibit high RBER. A block transitions into S-state when the T-state block is left idle for at least a threshold period of time (minutes to a few hours, depending on temperature), or other blocks on the same plane are erased at least a threshold number of times. After a read operation is performed on a block with S-state, the block transitions to a T-state in a few or a few tens of milliseconds. An S-state block with high RBER is, however, a threat to TR and performance and may cause QoS issues. Therefore, efforts can be made to maintain all the blocks on the memory sub-system in a T-state. A read operation performed by a host can serve as S-state to T-state trigger; however this depends on the host traffic pattern. Consequently, first read issues are more common in larger capacity drives because the host's read operation can only reach a small portion of blocks on the drive during the S-state to T-state transition. The term "first read" is defined as a read operation performed to transition a memory cell (e.g. a block) of a memory sub-system (e.g. SSD) from an S-state to T-state.

Besides serving host read and write requests, a memory sub-system can periodically read and check (and determine the condition of) each block in the backend, and perform a media management operation, e.g., by folding the block if any codeword demonstrates a high trigger rate or reliability risk. The folding operation may involve relocating the data stored at the affected block of the memory device to another block. A "full scan instance" is performed when every WL or page of every block of the memory device has been scanned within the time period specified by the system requirements. However, a full scan instance can take a long time to complete; sometimes a few tens of days or up to a few months. Therefore, a full scan instance can be divided into a number of smaller 'scan instances' where each scan instance scans only a portion of the WLs or pages while still scanning all the blocks on the drive. Such a scan instance can still take a few days to complete.

For each scan instance, the scan is performed using a nested loop where block index is the outer loop, and the page index is the inner loop. So the blocks are scanned one by one, and inside each block a number of ordinary and mandatory WLs are scanned. By doing so, a large portion of blocks can return to S-state if the drive remains idle, because it takes several days for the media scan to visit the same block again.

Aspects of the present disclosure address the above issues by performing a media scan operation where for each scan instance, the scan is performed using a nested loop where the page index is the outer loop and the block index is the inner loop, and each scan instance includes a number of ordinary WLs and a number of mandatory WLs. By doing so, for a certain block, it is more frequently (in minutes) read by media scan, since the block index is in the inner loop and the inner loop takes a shorter time to finish. Therefore, the disclosed method poses much less a risk of first read issue.

In some embodiments, a media scan operation is performed on an ordinary wordline across two or more blocks in a die of the memory device, thereby transitioning all memory cells on those blocks from S state to T state. The controller performs the media scan operation on ordinary wordlines across two or more blocks in the die, in a wordline-by-wordline fashion, and if one or more pages of the block exhibit an RBER above a predetermined threshold, then the controller performs a data management operation (e.g., folding operation) on the block. The controller of the memory sub-system further performs a media scan operation on a mandatory wordline across two or more blocks in the die of the memory device, thereby transitioning all memory cells on those blocks from S state to T state. The controller performs the media scan operation on all mandatory wordlines across all blocks in the die, in a wordline-by-wordline fashion. The controller further "folds" any block with a raw bit error rate above a predetermined threshold value so that the overall RBER of the die is reduced.

Advantages of this approach include, but are not limited to reducing and/or fully eliminating the first read high RBER issues on the memory sub-system, especially for large capacity (e.g. 16 TB+) drives. The systems and methods disclosed also improve runtime performance and QoS of memory sub-systems. The systems and methods disclosed and introduce no additional reads/writes on the NAND side. Additionally, there is no increased backend traffic bandwidth consumption. The systems and methods disclosed result in finer temporal scanning granularity for each block to better identify potential trigger rate or reliability risks than some other media scan methodologies. The systems and methods disclosed very flexibly adjust the scanning scheduling details and maximize scan effectiveness to guarantee the media data quality on mandatory (i.e., weakest) WLs. The systems and methods disclosed also limit the block read interval to be no more than a few minutes. The risk to stable state is even lower when considering host read traffics. The latent read disturb (LRD) concern is minimal since a block can undergo with only at most of a few hundred LRD reads for a media scan instance duration of 2-3 days, it brings negligible impact to NAND data integrity since the media can generally tolerate a few hundred thousand of LRD reads or even more.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a Zoned Namespace (ZNS) SSD, a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In one embodiment, the memory sub-system 110 includes a media scan component 113 that performs a media scan operation on a memory device 130. The media scan operation includes a certain number of scan iterations such that each iteration scans for all blocks of the memory device, the pages addressable by one or more mandatory wordlines, and the pages addressable by one or more ordinary wordlines. In an illustrative example, the media scan component 113 can identify a subset of "mandatory" wordlines of a memory device 130, such that the pages addressable by the identified "mandatory" wordlines are more susceptible to various memory degradation mechanisms. In one embodiment, some wordlines of the memory device can be pre-characterized as "mandatory," and the identifiers of those wordlines can be stored in the firmware metadata structure residing in one or more reserved metadata blocks of the memory device 130. In another embodiment, the "mandatory" wordlines can be dynamically identified during the lifecycle of the memory device 130, e.g., by selecting, among all wordlines of the memory device 130, a subset of wordlines whose pages collectively generate more than a threshold number of errors can be classified as "mandatory" wordlines and a subset of wordlines whose pages collectively generate less than (or equal to) the threshold number of errors can be classified as "ordinary" wordlines. In some embodiments, the threshold can be derived, for example, from an aggregate (e.g., median or average) error rate of all wordlines put together.

In some embodiments, the memory sub-system controller 115 includes at least a portion of media scan component 113. For example, the memory sub-system controller 115 can include a processor 117 (e.g., a processing device) configured to execute instructions stored in local memory 119 for performing the operations described herein. In other embodiments, media scan component 113 is part of memory sub-system 110, but is separate from memory sub-system controller 115. In other embodiments, local media controller 135 includes at least a portion of media scan component 113 and is configured to perform the functionality described herein.

Figure 2A:
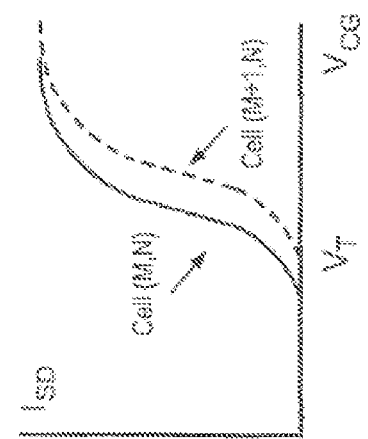
FIG. 2A illustrates schematically floating gate transistor-based memory cells as arranged in a memory device, in accordance with some embodiments of the present disclosure.
Figure 2B:
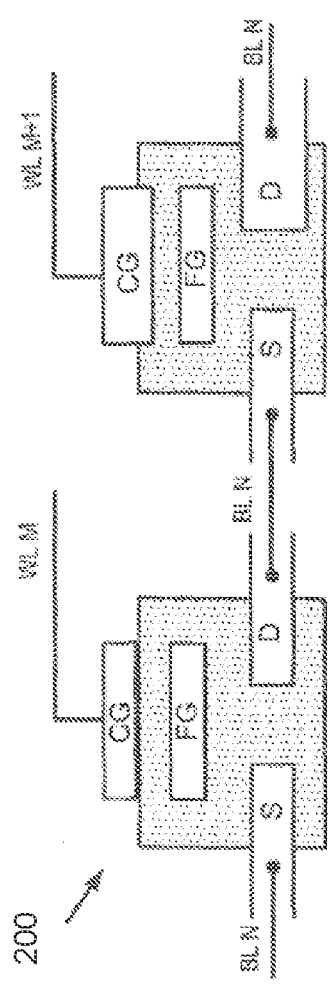
FIG. 2B illustrates schematically dependence of the source-drain current on the control gate voltage for two non-identical memory cells having different threshold control gate voltages, in accordance with some embodiments of the present disclosure.

As illustrated schematically in FIG. 2A, a memory cell of a memory device can be a transistor, such as metal-oxide-semiconductor field effect transistor (MOSFET), having a source (S) electrode and a drain (D) electrode to pass electric current there through. The source and drain electrodes can be connected to a bitline (BL). Multiple memory cells can share a bitline, as in NAND memory devices, in one implementation. For example, two memory cells 202 and 204 illustrated in FIG. 2A can be connected to the same bitline N and two different wordlines, M and M+1, respectively. Alternatively, e.g., in NOR memory devices, each memory cell can have a dedicated bitline that is not shared with other memory cells. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG}<V_T$, the source-drain electric current can be low, but can increase substantially once the control gate voltage has exceeded the threshold voltage, $V_{CG}>V_T$. Because the actual geometry of gates and electrodes of a memory cell (as well as the environment of the memory cell) can vary from cell to cell, the threshold voltages $V_T$ can be different even for transistors implemented on the same die. For example, as illustrated in FIG. 2A, memory cell 204 can include gates and electrodes having different sizes. As a result, transistors of the same memory device can be characterized by a distribution of their threshold voltages, $P(V_T)$ =$dW/dV_T$, so that $dW=P(V_T)dV_T$ represents the probability that any given transistor has its threshold voltage within the interval $[V_T, V_T+dV_T]$. For example, FIG. 2B illustrates schematically dependence of the source-drain current $I_{SD}$ on the control gate voltage for two non-identical memory cells, e.g. memory cell 202 (solid line) and memory cell 204 (dashed line), having different threshold control gate voltages, in one exemplary implementation.

To make a memory cell non-volatile, the cell can be further equipped with a conducting island—a floating gate (FG)—that can be electrically isolated from the control gate, the source electrode, and the drain electrode by insulating layers (depicted in FIG. 2A as the dotted region). In response to an appropriately chosen positive (in relation to the source potential) control gate voltage $V_{CG}$, the floating gate can receive (via Fowler-Nordheim tunneling or hot electron injection) a negative electric charge Q, which can be permanently stored thereon even after the power to the memory cell—and, consequently, the source-drain current—is ceased. The charge Q can affect the distribution of threshold voltages $P(V_T, Q)$. Generally, the presence of the negative charge Q shifts the distribution of threshold voltages towards higher voltages, compared with the distribution $P(V_T)$ for an uncharged floating gate. This happens because a stronger positive control gate voltage $V_{CG}$ can be needed to overcome a negative potential of the floating gate charge Q. If any charge of a sequence $Q_k$ of charges with $1 \leq k \leq 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N-1$ valley margins.

Figure 2C:
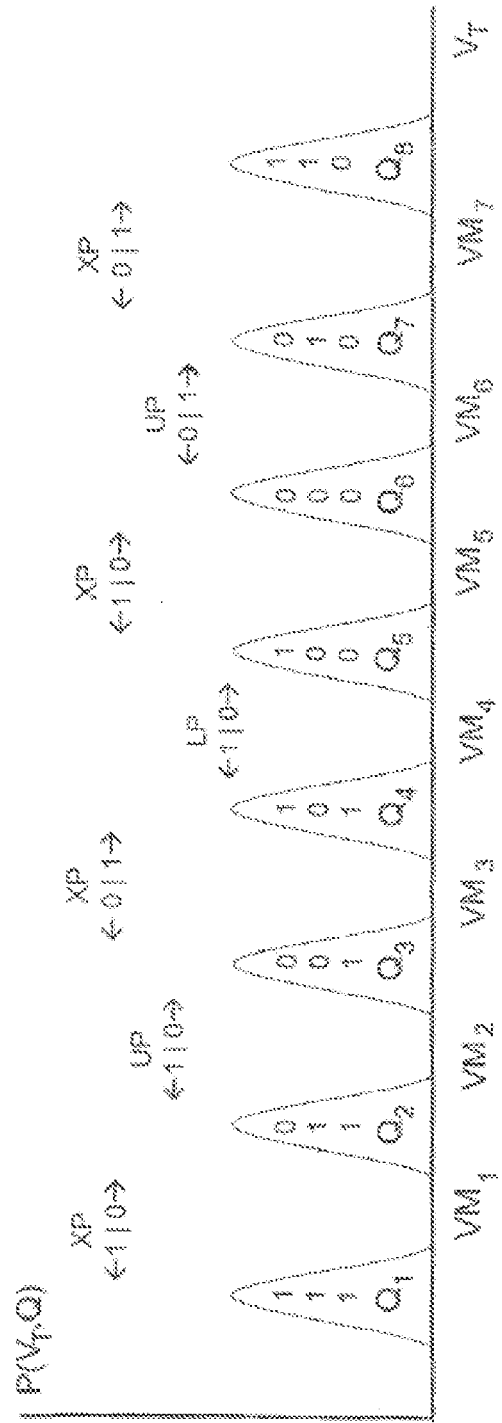
FIG. 2C illustrates schematically a distribution of threshold control gate voltages for a flash memory cell capable of storing three bits of data by programming the memory cell into at least eight charge states that differ by the amount of charge on the cell's floating gate in accordance with some embodiments of the present disclosure.

FIG. 2C illustrates schematically a distribution of threshold control gate voltages for a memory cell capable of storing three bits of data by programming the memory cell into at least eight charge states that differ by the amount of charge on the cell's floating gate. FIG. 2C shows distributions of threshold voltages $P(V_T, Q_k)$ for $2^N=8$ different charge states of a tri-level cell (TLC) separated with $2^3-1=7$ valley margins $VM_k$. Accordingly, a memory cell programmed into a charge state k-th (i.e., having the charge $Q_k$ deposited on its floating gate) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

In general, storage devices with NAND memory are classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In some storage devices, each wordline of the memory can have the same type of cells within a given partition of the memory device. That is, all wordlines of a block or a plane are SLC memory, or all wordlines are MLC memory, or all wordlines are TLC memory, or all wordlines are QLC memory. Because an entire wordline is biased with the same control gate voltage $V_{CG}$ during write or read operations, a wordline in SLC memory typically hosts one memory page (e.g., a 16 KB or a 32 KB page) that is programmed in one setting (by selecting various bitlines consecutively). A wordline of a higher-level (MLC, TLC, or QLC) memory cell can host multiple pages on the same wordline. Different pages can be programmed (by the memory controller 115 via electronic circuitry) in multiple settings. For example after a first bit is programmed on each memory cell of a wordline, adjacent wordlines can first be programmed before a second bit is programmed on the original wordline. This can reduce electrostatic interference between neighboring cells. As explained above, the memory controller 115 can program a state of the memory cell and then read can read this state by comparing a read threshold voltage $V_T$ of the memory cell against one or more read level thresholds. The operations described herein can be applied to any N-bit memory cells.

For example, a TLC can be capable of being in one of at least eight charging states $Q_k$ (where the first state can be an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 115.

The read operation can be performed after a memory cell is placed in one of its charged states $Q_k$ by a previous write operation. For example, to program (write) 96 KB (48 KB) of data onto cells belonging to a given wordline M of a TLC, a first programming pass can be performed. The first programming pass can store 32 KB (16 KB) of data on the wordline M by placing appropriate charges on the floating gates of memory cells of the workline M. For example, a charge Q can be placed on the floating gate of a specific cell. A cell is programmed to store value in its lower-page (LP) bit if the cell is driven to any of the charge states $Q_1$, $Q_2$, $Q_3$, or $Q_4$. The cell is programmed to store value 0 in its LP bit if the cell is driven to any of the charge states $Q_5$, $Q_6$, $Q_7$, or $Q_8$. As a result, during a read operation it can be determined that the applied control gate voltage $V_{CG}$ placed within the fourth valley margin $VM_4$ is sufficient to open the cell to the source-drain electric current. Hence, it can be concluded that the cell's LP bit is in state 1 (being in one of the charge states $Q_k$ with k≤4). Conversely, during the read operation it can be determined that the applied control gate voltage $V_{CG}$ within the fourth valley margin is insufficient to open the cell to the source-drain electric current. Hence, it can be concluded that the cell's LP bit is in state 0 (being in one of the charge states $Q_k$ with k>4).

After cells belonging to the M-th wordline have been programmed as described, the LP has been stored on the M-th wordline and the programming operation can proceed with additional programming passes to store an upper page (UP) and an extra page (XP) on the same wordline. Although such passes can be performed immediately after the first pass is complete (or even all pages can be programmed in one setting), in order to minimize errors it can be advantageous to first program LPs of adjacent wordlines (e.g., wordlines M+1, M+2, etc.) prior to programming UP and XP into wordline M. Indeed, due to electrostatic interaction between electric charges, charges that are placed on a given wordline can modify threshold voltages of memory cells belonging to adjacent wordlines (as well as thresholds of memory cells within the same wordline). Therefore, it can be disadvantageous to have significantly different charges on neighboring memory cells. Accordingly, it can be beneficial—from the perspective of minimizing occurrences of erroneously programmed bits—to program adjacent wordlines incrementally. For example, programming of a LP on wordline M can be followed with programming of a LP into wordline M+1, followed with programming an LP into wordline M+2, followed with programing an UP into wordline M, and so on, with virtually unlimited number of possible sequences of programming various pages on various wordlines.

When the UP is to be programmed into wordline M, a charge state of a memory cell can be adjusted so that its distribution of threshold voltages is further confined within a known valley margins VM. For example, a cell that is in one of the charge states $Q_1$, $Q_2$, $Q_3$, or $Q_4$ (accorded bit 1 status for LP programming) can be driven to just one of two states $Q_1$ or $Q_2$, in which case the cell is to store value 1 in its UP bit. Conversely, a cell can be driven to one of two states $Q_3$ or $Q_4$ to store value 0 in its UP bit. As a result, during a read operation it can be determined that the applied control gate voltage $V_{CG}$ within the second valley margin $VM_2$ is sufficient to open the cell to the source-drain electric current. Hence, it can be concluded that the cell's UP bit is in state 1 (being in one of the charge states $Q_k$ with k≤2). Conversely, during a read operation it can be determined that the applied control gate voltage $V_{CG}$ within the second valley margin $VM_2$ is insufficient to open the cell to the source-drain electric current. Hence, it can be concluded that the cell's UP bit is in state 0 (being in one of the charge states $Q_k$ with 2<k≤4). Likewise, charge states $Q_5$, $Q_6$, $Q_7$, or $Q_8$ (accorded bit 0 status for LP programming) can be further driven to the states $Q_5$ or $Q_6$ (UP bit value 0) or the states $Q_7$ or $Q_8$ (UP bit value 1).

Similarly, the extra page (XP) can be programmed into the wordline M by further adjusting the charge state of each its memory cell. For example, a cell that is in the logic state 10 (i.e., UP bit stores value 1 and LP bit stores value 0) and is in one of the charge states $Q_7$ or $Q_8$ can be driven to state $Q_7$ to store value 0 in its XP bit (logic state 010). Alternatively, the cell can be driven to charge state $Q_8$ to store value 1 in its XP bit (logic state 110). As a result, during a read operation it can be determined that the applied control gate voltage $V_{CG}$ within the seventh valley margin is insufficient to open the cell to the source-drain electric current. Hence, the memory controller 115 can determine that the cell's logic state is 110 (corresponding to charge state $Q_8$). Conversely, during a read operation it can be determined that the applied control gate voltage $V_{CG}$ within the seventh valley margin $VM_7$ is sufficient to open the cell to the source-drain electric current. Hence, the memory controller 115 can determine that the cell's XP bit stores value 0. If it is further determined that control gate voltages $V_{CG}$ within the first six valley margins are insufficient to open the cell to the electric current, the memory controller 115 can ascertain the logic state of the cell as 010 (corresponding to the charge state $Q_7$). FIGS. 2A-2C refer to floating gate (FG) NAND memory cells for illustrative purposes only. The memory device may include replacement gate (RG) NAND memory cells instead of FG NAND memory cells, which operate on the same principles as the FG NAND memory cells described above.

Figure 3:
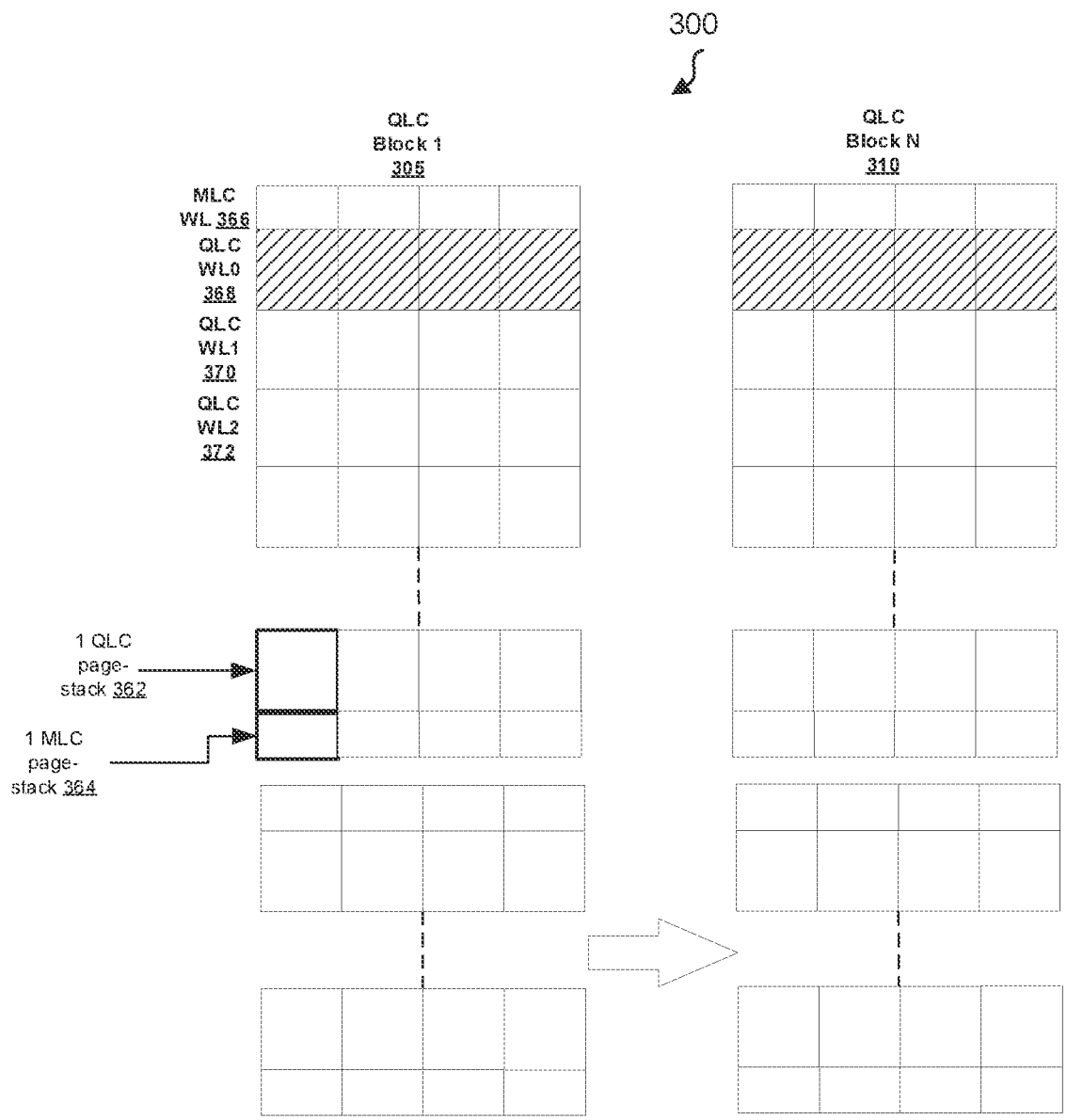
FIG. 3 illustrates memory cells in an example memory device in which a media scan operation is performed to reduce first read raw bit error rate in accordance with some embodiments of the present disclosure.

FIG. 3 illustrates memory cells in an example memory device 300 in which a media scan operation is performed to reduce first read raw bit error rate, in accordance with some embodiments of the present disclosure. Memory device 300 includes a plurality of QLC blocks 305, 310 numbered 1 through N. Each QLC block (e.g. QLC block 305) is an ordered set of memory cells and the wordlines (e.g. wordlines 366-372) are connected to those memory cells. The example die illustrated in FIG. 3 includes QLC page stacks 362 and one or more MLC page stacks 364 at the boundaries of the die. The QLC page stack 362 may include four pages; a lower page, an upper page, an extra page, and a top page. Each page in a page stack may be associated with one of wordlines 366-372 or other wordlines of the block. In one embodiment, the memory controller of the memory subsystem identifies an ordinary wordline (e.g. QLC WL0 368) of the memory device 300, and performs a media scan operation with respect to memory pages addressable by the ordinary wordline 368 sequentially across all blocks on the memory device. Each page of the memory pages can be contained by a respective management unit (e.g., QLC Block1 305 or a superblock). If the memory controller determines that a value of a data state metric (e.g., RBER) of a memory page of the memory pages addressable by the ordinary wordline satisfies a specified condition (e.g., is above a predetermined threshold), then the controller performs a media management operation (e.g., folding operation) with respect to the management unit (e.g., QLC Block1 305) containing the memory page. For example, if the RBER for any block is above a threshold value, then the controller "folds" the block for the lack of a predetermined RBER, thereby relocating the data stored at the affected block of the memory device to another block. In one embodiment, the data state metric can be derived from the RBER, e.g., by applying a known mathematical transformation to the RBER, including a statistical aggregation function such as mean, median, average, etc. The memory controller then identifies a mandatory wordline (e.g., QLC WL1 370) of the memory device 300, and performs a media scan operation with respect to memory pages addressable by the mandatory wordline 370 sequentially across all blocks on the memory device. Each page of the memory pages can be contained by the respective management unit (e.g., QLC Block1 305 or a superblock). If the memory controller determines that a value of the data state metric (e.g., RBER) of a memory page of the memory pages addressable by the mandatory wordline 370 satisfies a specified condition (e.g., is above a predetermined threshold), then the memory controller performs a media management operation (e.g., folding operation) with respect to the management unit (e.g., QLC Block1 305) containing the memory page. For example, if the RBER for any block is above a threshold value, then the controller folds the block for the lack of a predetermined RBER, thereby relocating the data stored at the affected block of the memory device to another block. In one embodiment, the data state metric can be derived from the RBER, e.g., by applying a known mathematical transformation to the RBER, including a statistical aggregation function such as mean, median, average, etc.

In some instances, a change in the order of media scan can cause mandatory WLs to be scanned together, which may result in a 'concentrated' block refresh where mandatory WLs are scanned multiple times before an ordinary WL can be scanned (since mandatory WLs are weakest and are likely to cause block refreshes). Accordingly, the following methodology for media scan may be used to avoid concentrated block refreshes. For example, different blocks (or block groups) can use different page scanning orders in order to avoid concentrated block refreshes.

In an example media scan instance for a QLC NAND, which may include up to a few thousands of blocks on each die, the memory controller scans 24 ordinary WLs and 8 mandatory WLs; a total of (24+8)*4=128 pages. Assuming each scan instance takes about two days to complete, conventional methodologies scan every block every two days, which poses higher first read high RBER risk. However, the method disclosed here can scan every block every ~20 min, which poses a much lower first read high RBER risk.

Figure 4:
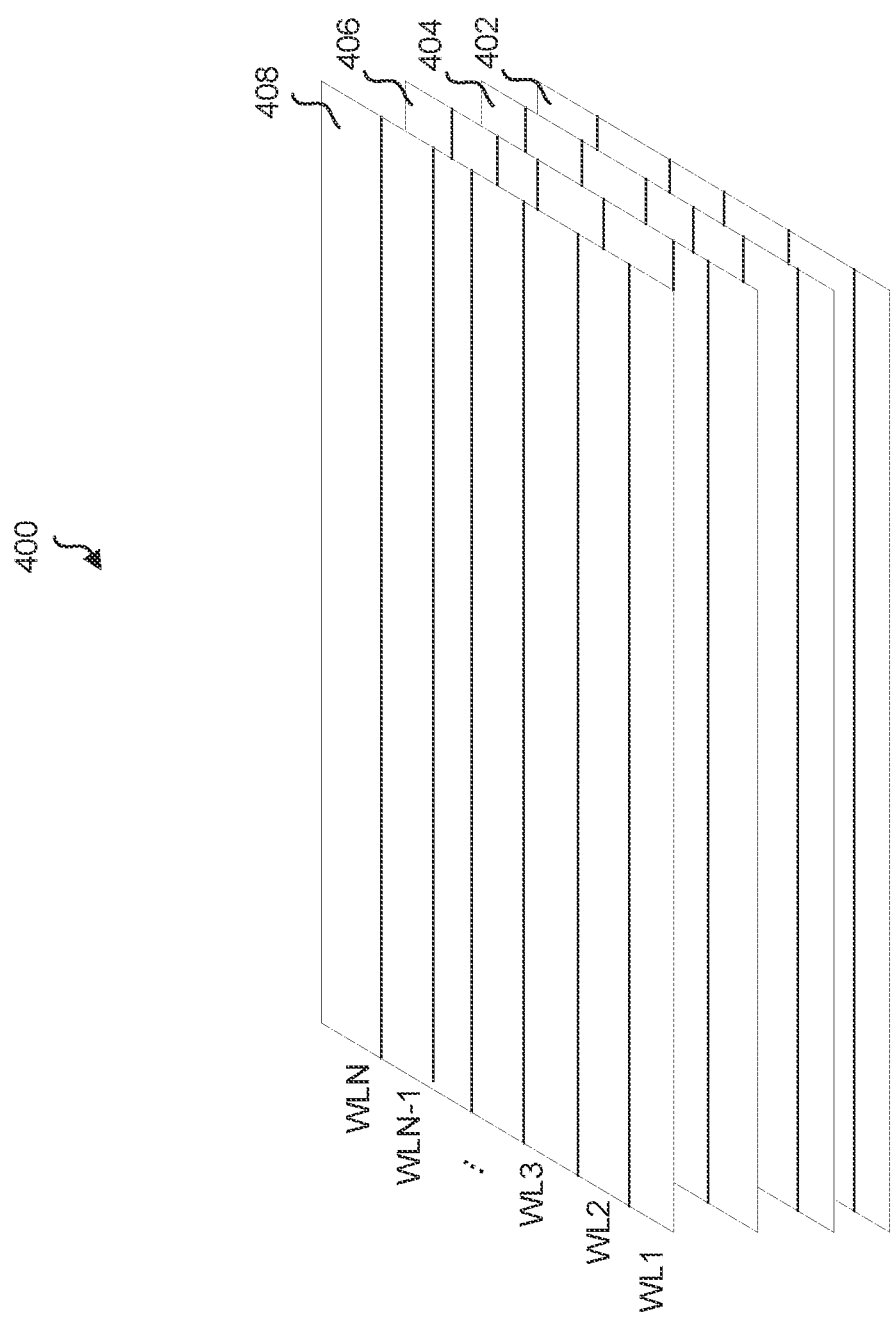
FIG. 4 illustrates an example page stack in a memory device on which a media scan operation is performed in accordance with some embodiments of the present disclosure.

FIG. 4 illustrates an example QLC page stack 400 including four page collections; a lower page collection 402, an upper page collection 404, an extra page collection 406, and a top page collection 408. The memory cells in block 400 are associated with wordlines WL1, WL2, WL3, . . . WLN-1, WLN. In other words, each of the wordlines WL1, WL2, WL3, . . . WLN-1, WLN in block 400 is associated with a plurality of cells, which are not illustrated in this figure for simplicity. In one example, the controller of the memory sub-system may use the following scan vector: [oWL1LP, oWL1UP, oWL1XP, oWL1TP, oWL2LP, oWL2UP, . . . , oWL9LP, oWL9UP, . . . , oWL17LP, . . . , oWL24LP, . . . , oWL24TP, mWL1LP, . . . , mWL8TP] such that for the 1st quarter of blocks on the die the scan start page is oWL1LP, for the 2nd quarter of blocks on the die the scan start page is oWL9LP, for the 3rd quarter of blocks on the die the scan start page is oWL17LP, for 4th quarter of blocks on the die the the scan start page is mWL1LP, and continuing performing circular shift scanning on the above WL/page vectors. The acronyms used in this example can be summarized as follows:

| Acronym | Description |
| --- | --- |
| oWL1LP | Ordinary Wordline Index 1, Lower Page |
| oWL1UP | Ordinary Wordline Index 1, Upper Page |
| oWL1XP | Ordinary Wordline Index 1, Extra Page |
| oWL1TP | Ordinary Wordline Index 1, Top Page |
| oWL2LP | Ordinary Wordline Index 2, Lower Page |
| . . . | . . . |
| mWL1LP | Mandatory Wordline Index 1, Lower Page |
| . . . | . . . |

In another embodiment, the controller of the memory sub-system may use the following scan vector, which results in an even more uniformly distributed mandatory WLs. For example, the controller may use the scan vector [oWL1LP, oWL2LP, oWL3LP, mWL1LP, oWL4LP, oWL5LP, oWL6LP, mWL2LP, . . . , oWL22LP, oWL23LP, oWL24LP, mWL8LP, oWL1UP, oWL2UP, oWL3UP, mWL1UP, . . . , oWL22UP, oWL23UP, oWL24UP, mWL8UP, . . . , oWL1TP, oWL2TP, oWL3TP, mWL1TP, . . . , oWL22TP, oWL23TP, oWL24TP, mWL8TP] such that each block's scan start page will be block index mod 128.

In another embodiment, the controller of the memory sub-system may use the following scan vector to allow more frequent scans on mandatory WLs. For example, it may be preferred to scan mandatory WLs with a higher frequency than the ordinary WLs (e.g., 1 day scan interval for mandatory WLs). In one example, the controller of the memory sub-system may use the following ordinary WL scan vector: [oWL1LP, oWL1UP, oWL1XP, oWL1TP, oWL2LP, oWL2UP, oWL2XP, oWL2TP, . . . , oWL24LP, oWL24UP, oWL24XP, oWL24TP], and the mandatory WL scan vector may be modified to be [mWL1LP, mWL1UP, mWL1XP, mWL1TP, mWL2LP, mWL2UP, mWL2XP, mWL2TP, . . . , mWL8LP, mWL8UP, mWL8XP, mWL8TP, mWL1LP, mWL1UP, mWL1XP, mWL1TP, mWL2LP, mWL2UP, mWL2XP, mWL2TP, . . . , mWL8LP, mWL8UP, mWL8XP, mWL8TP], which results in two times as many media scans for the mandatory WLs as compared to the ordinary WLs. In one embodiment, the above two vectors may be uniformly mixed to generate a final scan vector. As it may be apparent to one of ordinary skill in the art, these scan vectors are purely exemplary and the order of elements in the two scan vectors may be modified as desired to result in an optimized configuration that maximizes TR and REL risk detection capability of the memory sub-system. For example, the controller of the memory sub-system may perform media scans three or even four times as many for the mandatory WLs as compared to the ordinary WLs.

Figure 5A:
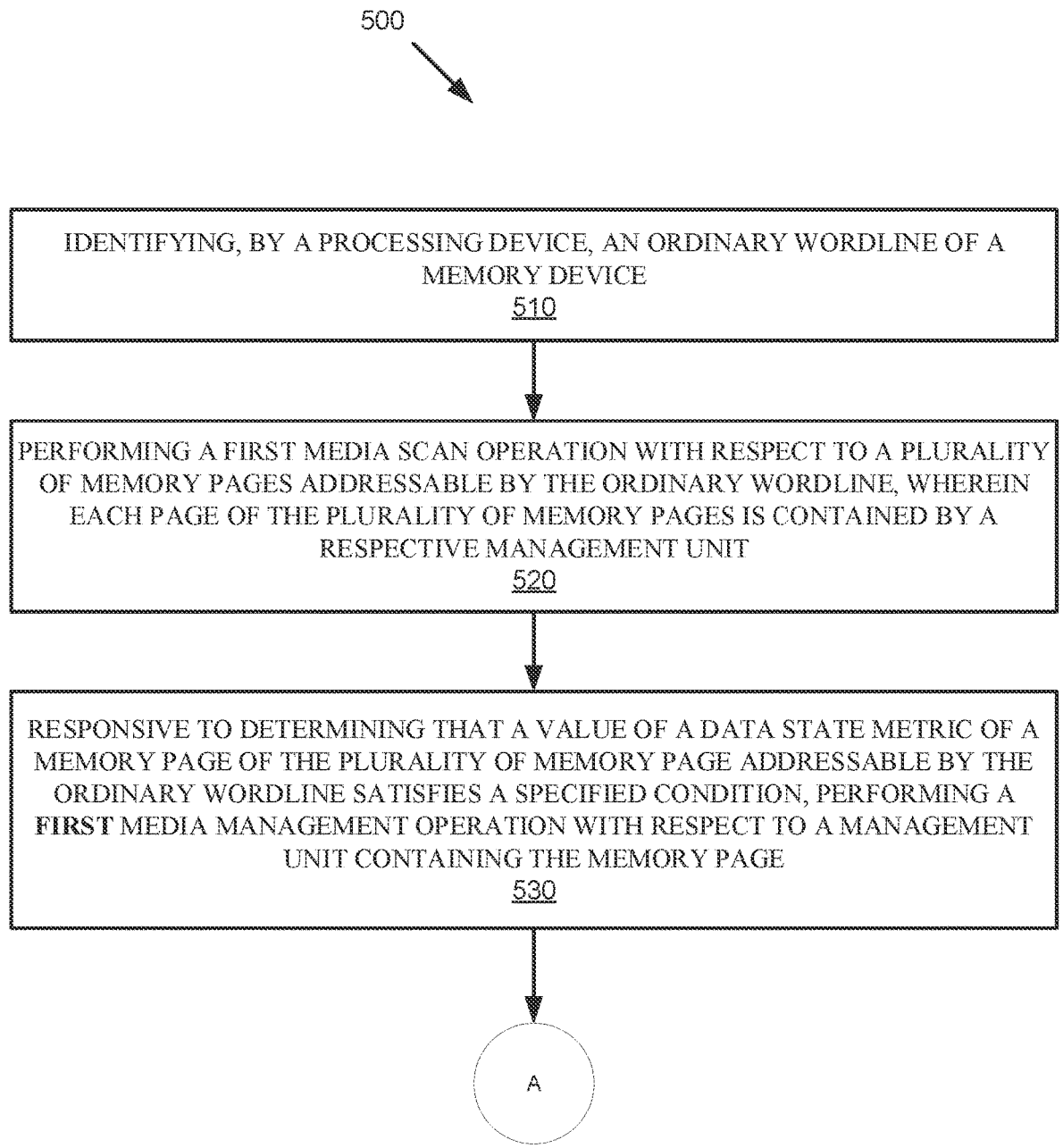
FIGS. 5A and 5B illustrate a flow diagram of an example method for performing a media scan operation in a memory device in a memory sub-system.
Figure 5B:
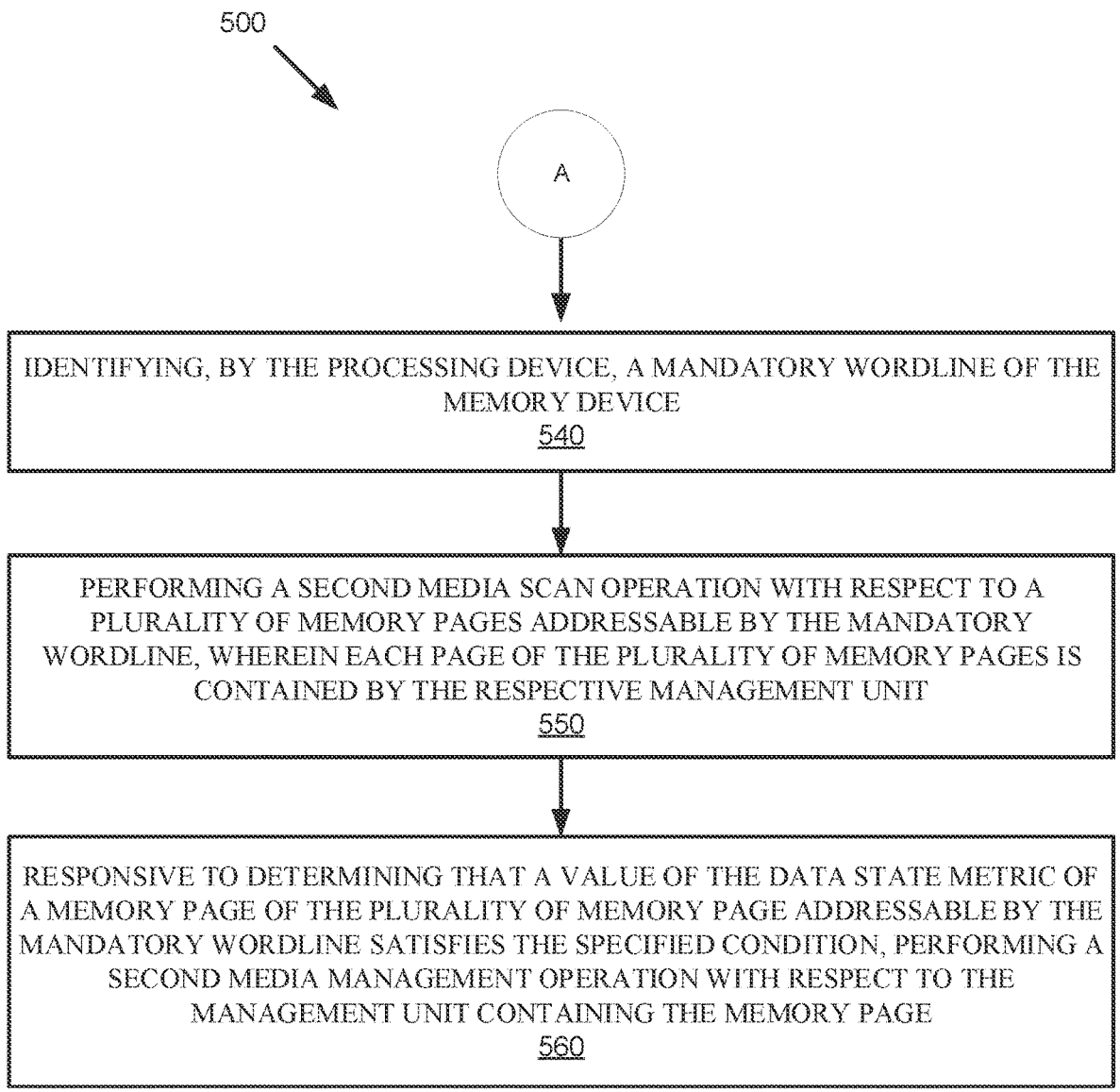

FIGS. 5A & 5B illustrate a flow diagram of an example method 500 for performing a media scan operation in a memory device in a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by media scan component 113, writeback component 137, and local media controller 135 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

FIG. 5A illustrates part of a flow diagram of an example method 500 for performing a media scan for transitioning memory cells in a memory device from a stable (S) state to a transient (T) state and reducing or eliminating the RBER. At step 510, the processing device identifies an ordinary wordline (e.g. QLC WL0 368) of a memory device (e.g., memory device 300). At step 520, the processing device performs a media scan operation with respect to memory pages addressable by an ordinary wordline (e.g., QLC WL0 368) sequentially across all blocks on the memory device. Each page of the memory pages can be contained by a respective management unit (e.g., QLC Block1 305 or a superblock). At step 530, responsive to determining that a value of a data state metric (e.g., RBER) of a memory page of the memory page addressable by the ordinary wordline satisfies a specified condition (e.g., is above a predetermined threshold), the processing device performs a media management operation (e.g., folding operation) with respect to the management unit (e.g., QLC Block1 305) containing the memory page. For example, if the RBER for any block is above a threshold value, then the processing device "folds" the block for the lack of a predetermined RBER, thereby relocating the data stored at the affected block of the memory device to another block. In one embodiment, the data state metric can be derived from the RBER, e.g., by applying a known mathematical transformation to the RBER, including a statistical aggregation function such as mean, median, average, etc.

FIG. 5B illustrates part of the flow diagram of the example method 500 for performing a media scan for transitioning memory cells in a memory device from a stable (S) state to a transient (T) state and reducing or eliminating the RBER. At step 540, the processing device identifies a mandatory wordline (e.g., QLC WL1 370) of the memory device (e.g., memory device 300). At step 550, the processing device performs a media scan operation with respect to memory pages addressable by the mandatory wordline (e.g. QLC WL1 370) sequentially across all blocks on the memory device. Each page of the memory pages can be contained by the respective management unit (e.g., QLC Block1 305 or a superblock). At step 560, responsive to determining that a value of the data state metric (e.g., RBER) of a memory page of the memory pages addressable by the mandatory wordline satisfies a specified condition (e.g., is above a predetermined threshold), then the process-ing device performs a media management operation (e.g., folding operation) with respect to the management unit (e.g., QLC Block1 305) containing the memory page. For example, if the RBER for any block is above a threshold value, then the processing device folds the block for the lack of a predetermined RBER, thereby relocating the data stored at the affected block of the memory device to another block. In one embodiment, the data state metric can be derived from the RBER, e.g., by applying a known mathematical transformation to the RBER, including a statistical aggregation function such as mean, median, average, etc. As illustrated in the above examples (e.g., with respect to the scan vectors), the media scan operation with respect to the memory pages addressable by the ordinary wordline and the media scan operation with respect to the memory pages addressable by the mandatory wordline may be sequenced such that the mandatory wordlines are scanned more number of times than the ordinary wordlines.

In some instances, different blocks (or block groups) can use different page scanning orders in order to avoid concentrated block refreshes. In one example, the controller of the memory sub-system may use the following scan vector: [oWL1LP, oWL1UP, oWL1XP, oWL1TP, oWL2LP, oWL2UP, ..., oWL9LP, oWL9UP, ..., oWL17LP, ..., oWL24LP, ..., oWL24TP, mWL1LP, ..., mWL8TP] such that for the 1st quarter of blocks on the die the scan start page is oWL1LP, for the 2nd quarter of blocks on the die the scan start page is oWL9LP, for the 3rd quarter of blocks on the die the scan start page is oWL17LP, for 4th quarter of blocks on the die the scan start page is mWL1LP, and continuing performing circular shift scanning on the above WL/page vectors.

In another embodiment, the controller of the memory sub-system may use the following scan vector, which results in an even more uniformly distributed mandatory WLs. For example, the controller may use the scan vector [oWL1LP, oWL2LP, oWL3LP, mWL1LP, oWL4LP, oWL5LP, oWL6LP, mWL2LP, ..., oWL22LP, oWL23LP, oWL24LP, mWL8LP, oWL1UP, oWL2UP, oWL3UP, mWL1UP, oWL22UP, ..., oWL23UP, oWL24UP, mWL8UP, ..., oWL1TP, oWL2TP, oWL3TP, mWL1TP, ..., oWL22TP, oWL23TP, oWL24TP, mWL8TP] such that each block's scan start page will be block index mod 128.

In another embodiment, the controller of the memory sub-system may use the following scan vector to allow more frequent scans on mandatory WLs. For example, it may be preferred to scan mandatory WLs with a higher frequency than the ordinary WLs (e.g., 1 day scan interval for mandatory WLs). In one example, the controller of the memory sub-system may use the following ordinary WL scan vector: [oWL1LP, oWL1UP, oWL1XP, oWL1TP, oWL2LP, oWL2UP, oWL2XP, oWL2TP, ..., oWL24LP, oWL24UP, oWL24XP, oWL24TP], and the mandatory WL scan vector may be modified to be [mWL1LP, mWL1UP, mWL1XP, mWL1TP, mWL2LP, mWL2UP, mWL2XP, mWL2TP, ..., mWL8LP, mWL8UP, mWL8XP, mWL8TP, mWL1LP, mWL1UP, mWL1XP, mWL1TP, mWL2LP, mWL2UP, mWL2XP, mWL2TP, ..., mWL8LP, mWL8UP, mWL8XP, mWL8TP], which results in two times as many media scans for the mandatory WLs as compared to the ordinary WLs. In one embodiment, the above two vectors may be uniformly mixed to generate a final scan vector. These scan vectors are purely exemplary and the order of elements in the two scan vectors may be modified by the memory controller to result in an optimized configuration that maximizes TR and REL risk detection capability of the memory sub-system. For example, the memory controller may determine that a specific scan order/vector results in a higher RBER for the memory device, and therefore modify the scan order/vector in the next media scan operation resulting in a lower RBER. Accordingly, the controller may perform the media scan operation on the mandatory wordlines twice as many times as performing the media scan operation on the ordinary wordlines, perform the media scan operation on the mandatory wordlines three times more than performing the media scan operation on the ordinary wordlines, or perform the media scan operation on the mandatory wordlines four times more than performing the media scan operation on the ordinary wordlines. Since mandatory wordlines generally have higher RBER than ordinary wordlines, scanning mandatory wordlines more number of times than the ordinary wordlines may result in folding of blocks that cause the RBER of the memory device to be above a predetermined threshold. Although wordlines are provided as examples in the above embodiments, the methods and systems disclosed may use pages instead of wordlines or a combination thereof.

Figure 6:
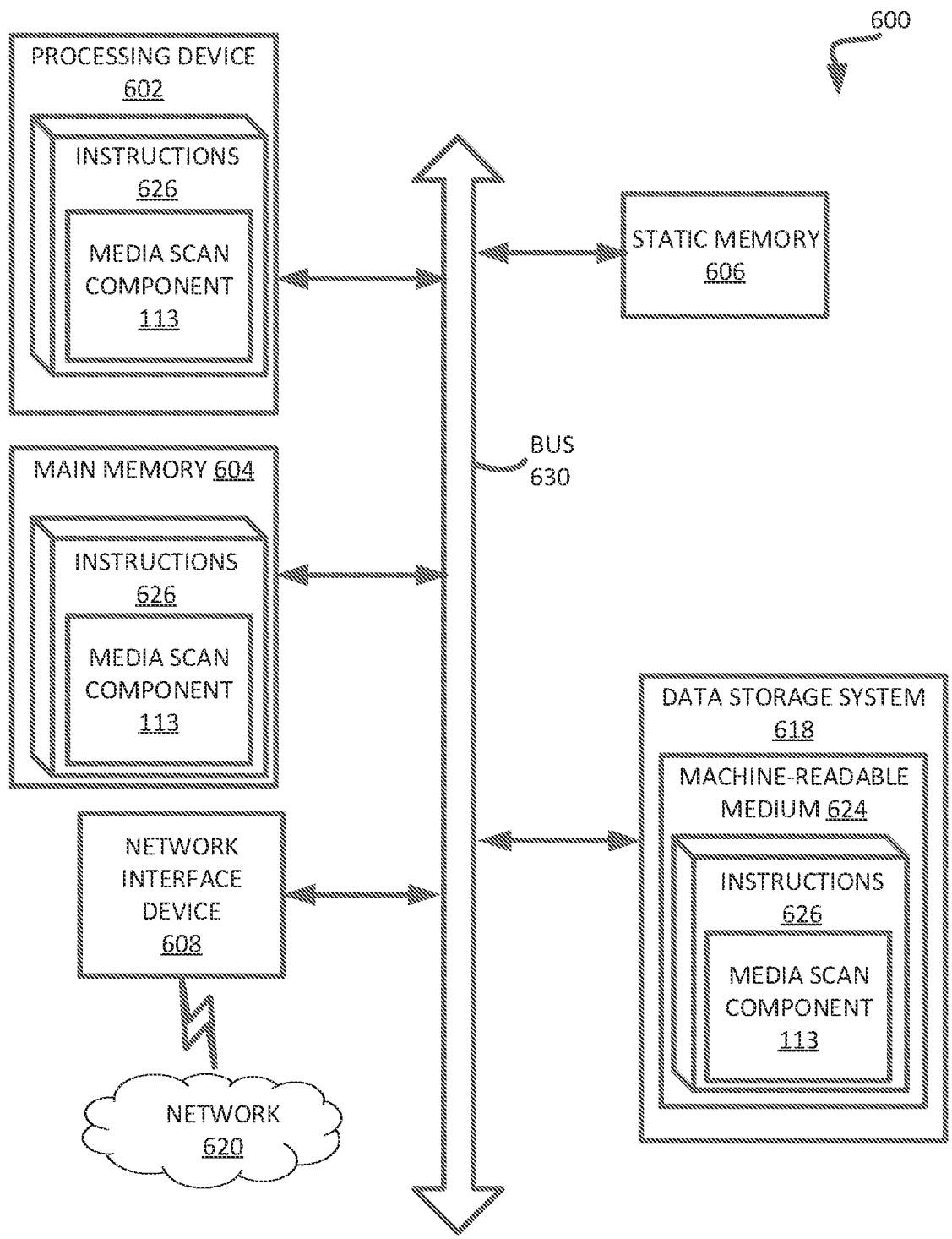
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to media scan component 113, memory sub-system controller 115, or local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to media scan component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
identifying, by a processing device, among a plurality of wordlines of a memory device, a first subset of ordinary wordlines and a second subset of mandatory wordlines, wherein a mandatory wordline of the second subset exhibits a first value of a data state metric that exceeds a second value of the data state metric exhibited by an ordinary wordline of the first subset;
performing a first media scan operation with respect to a plurality of memory pages addressable by the ordinary wordline, wherein each page of the plurality of memory pages is contained by a respective management unit, and wherein an order of media scan operations is based on a number of mandatory wordlines and ordinary wordlines associated with a block of a plurality of blocks associated with the memory device;
responsive to determining that a value of the data state metric of a memory page of the plurality of memory pages addressable by the ordinary wordline satisfies a specified condition, performing a first media management operation with respect to a management unit containing the memory page;
performing a second media scan operation with respect to a plurality of memory pages addressable by the mandatory wordline, wherein each page of the plurality of memory pages is contained by the respective management unit; and
responsive to determining that a value of the data state metric of a memory page of the plurality of memory pages addressable by the mandatory wordline satisfies the specified condition, performing a second media management operation with respect to the management unit containing the memory page.

2. The method of claim 1, wherein the management unit comprises at least one of: a block or a superblock of the memory device.

3. The method of claim 1, wherein the data state metric reflects a raw bit error rate (RBER) of the memory page.

4. The method of claim 1, wherein the performing the first media management operation with respect to the management unit containing the memory page further comprises: relocating data stored at a block comprising the memory page to another block.

5. The method of claim 1, wherein performing the second media management operation with respect to the management unit containing the memory page further comprises relocating data stored at a block comprising the memory page to another block.

6. The method of claim 1, further comprising:
sequencing the first media scan operation with respect to the plurality of memory pages addressable by the ordinary wordline and the second media scan operation with respect to the plurality of memory pages addressable by the mandatory wordline.

7. The method of claim 6, further comprising:
performing the second media scan operation a higher number of times compared to the first media scan operation.

8. A system comprising:
a memory device; and
a processing device, operatively coupled with the memory device, to perform operations comprising:
identifying among a plurality of wordlines of a memory device, a first subset of ordinary wordlines and a second subset of mandatory wordlines, wherein a mandatory wordline of the second subset exhibits a first value of a data state metric that exceeds a second value of the data state metric exhibited by an ordinary wordline of the first subset;
performing a first media scan operation with respect to a plurality of memory pages addressable by the ordinary wordline, wherein each page of the plurality of memory pages is contained by a respective management unit, and wherein an order of media scan operations is based on a number of mandatory wordlines and ordinary wordlines associated with a block of a plurality of blocks associated with the memory device;
responsive to determining that a value of the data state metric of a memory page of the plurality of memory pages addressable by the ordinary wordline satisfies a specified condition, performing a first media management operation with respect to a management unit containing the memory page;
performing a second media scan operation with respect to a plurality of memory pages addressable by the mandatory wordline, wherein each page of the plurality of memory pages is contained by the respective management unit; and
responsive to determining that a value of the data state metric of a memory page of the plurality of memory pages addressable by the mandatory wordline satisfies the specified condition, performing a second media management operation with respect to the management unit containing the memory page.

9. The system of claim 8, wherein the management unit comprises at least one of: a block or a superblock of the memory device.

10. The system of claim 8, wherein determining that the value of the data state metric of the memory page of the plurality of memory pages addressable by the ordinary wordline satisfies the specified condition further comprises determining that a raw bit error rate (RBER) of the memory page of the plurality of memory pages addressable by the ordinary wordline is above a predetermined threshold.

11. The system of claim 8, wherein the performing the first media management operation with respect to the management unit containing the memory page further comprises relocating data stored at a block comprising the memory page to another block.

12. The system of claim 8, wherein the determining that the value of the data state metric of the memory page of the plurality of memory pages addressable by the mandatory wordline satisfies the specified condition further comprises determining that a raw bit error rate (RBER) of the memory page of the plurality of memory pages addressable by the mandatory wordline is above a predetermined threshold.

13. The system of claim 8, wherein performing the second media management operation with respect to the management unit containing the memory page further comprises relocating data stored at a block comprising the memory page to another block.

14. The system of claim 8, wherein the operations further comprise:
sequencing the first media scan operation with respect to the plurality of memory pages addressable by the ordinary wordline and the second media scan operation with respect to the plurality of memory pages addressable by the mandatory wordline; and
performing the second media scan operation a higher number of times compared to the first media scan operation.

15. A non-transitory computer-readable storage medium comprising instructions that, when executed by a processing device, cause the processing device to perform operations comprising:
identifying an ordinary wordline of a memory device;
performing a first media scan operation with respect to a plurality of memory pages addressable by the ordinary wordline, wherein each page of the plurality of memory pages is contained by a respective management unit;
responsive to determining that a value of a data state metric of a memory page of the plurality of memory page addressable by the ordinary wordline satisfies a specified condition, performing a first media management operation with respect to a management unit containing the memory page;
identifying a mandatory wordline of the memory device;
performing a second media scan operation with respect to a plurality of memory pages addressable by the mandatory wordline, wherein each page of the plurality of memory pages is contained by the respective management unit, and wherein an order of media scan operations is based on a number of mandatory wordlines and ordinary wordlines associated with a block of a plurality of blocks associated with the memory device; and
responsive to determining that a value of the data state metric of a memory page of the plurality of memory page addressable by the mandatory wordline satisfies the specified condition, performing a second media management operation with respect to the management unit containing the memory page.

16. The non-transitory computer-readable storage medium of claim 15, wherein determining that the value of the data state metric of the memory page of the plurality of memory pages addressable by the ordinary wordline satisfies the specified condition further comprises determining that a raw bit error rate (RBER) of the memory page of the plurality of memory pages addressable by the ordinary wordline is above a predetermined threshold.

17. The non-transitory computer-readable storage medium of claim 15, wherein performing the first media management operation with respect to the management unit containing the memory page further comprises relocating data stored at a block comprising the memory page to another block.

18. The non-transitory computer-readable storage medium of claim 15, wherein determining that the value of the data state metric of the memory page of the plurality of memory pages addressable by the mandatory wordline satisfies the specified condition further comprises determining that a raw bit error rate (RBER) of the memory page of the plurality of memory pages addressable by the mandatory wordline is above a predetermined threshold.

19. The non-transitory computer-readable storage medium of claim 15, wherein performing the second media management operation with respect to the management unit containing the memory page further comprises relocating data stored at a block comprising the memory page to another block.

20. The non-transitory computer-readable storage medium of claim 15, wherein the operations further comprise:
sequencing the first media scan operation with respect to the plurality of memory pages addressable by the ordinary wordline with the second media scan operation with respect to the plurality of memory pages addressable by the mandatory wordline; and
performing the second media scan operation a higher number of times compared to the first media scan operation.

* * * * *